US005152866A

United States Patent [19]
Hyman, Jr. et al.

[11] Patent Number: 5,152,866
[45] Date of Patent: Oct. 6, 1992

[54] PLASMA/RADIATION ASSISTED MOLECULAR BEAM EPITAXY METHOD

[75] Inventors: Julius Hyman, Jr., Los Angeles; John R. Beattie, Westlake Village; Jesse N. Matossian, Woodland Hills; Owen K. Wu; Juan F. Lam, both of Agoura Hills; Lawrence Anderson, Malibu, all of Calif.

[73] Assignee: Hughes Aircraft Company, Los Angeles, Calif.

[21] Appl. No.: 532,144

[22] Filed: May 31, 1990

Related U.S. Application Data

[63] Continuation-in-part of Ser. No. 281,309, Jan. 13, 1989, abandoned.

[51] Int. Cl.⁵ .............. C30B 23/02; C30B 23/08; C30B 25/02; C30B 35/00
[52] U.S. Cl. .................. 156/611; 156/602; 156/610; 156/DIG. 72; 156/DIG. 82; 427/576; 427/570; 427/255.2
[58] Field of Search ............ 156/602, 610, 611, 613, 156/614, DIG. 72, DIG. 82, DIG. 92; 427/255.1, 255.2, 35, 38, 39

[56] References Cited

U.S. PATENT DOCUMENTS

| | | | |
|---|---|---|---|
| 3,916,034 | 10/1975 | Tsuchimoto | 156/614 |
| 4,426,407 | 1/1984 | Morin et al. | 437/246 |
| 4,575,462 | 3/1986 | Dobson et al. | 156/610 |
| 4,622,093 | 11/1986 | Tsang | 156/610 |
| 4,681,653 | 7/1987 | Purdes et al. | 156/643 |
| 4,770,895 | 9/1988 | Hartley | 427/38 |
| 4,808,554 | 2/1989 | Yamazaki | 437/101 |

OTHER PUBLICATIONS

Appl. Phys. Lett. 51 (21), 23 Nov. 1987, L. M. Williams et al., "Plasma Enhanced Chemical Vapor Deposition of Epitaxial Mercury Telluride", pp. 1738-1740.

XV International Quantum Electronics Conference Technical Digest, Apr. 26-May 1, 1987, Baltimore, Md., p. 50.

Primary Examiner—Gary P. Straub
Attorney, Agent, or Firm—E. E. Leitereg; P. M. Coble; W. K. Denson-Low

[57] ABSTRACT

A molecular beam epitaxy (MBE) growth method and apparatus is disclosed which achieves a significantly improved sticking coefficient for materials like Hg upon a substrate, and thus a higher efficiency. A highly ionized, low pressure plasma is formed consisting of a mixture of ions of one substance of a compound to be epitaxially grown, neutral particles of the substance and electrons, and also preferably both ionization and excitation radiation. The plasma is directed onto a substrate together with a flux of the other substance in the compound; the flux can be in the form of either a vapor, or a second plasma. Radiation assisted epitaxial growth for Hg compounds in which ionization and excitation radiation are formed from Hg vapor and used to assist epitaxial growth with neutral Hg particles is also described. The plasma is formed in a special discharge chamber having a hollow cathode with an emissive-mix-free cathode insert. The source is preferably a refractory metal such as rolled tantalum foil, which is substantially emissive-material-free and does not contaminate the plasma. Good results are obtained by allowing the plasma to simply diffuse out through an exit port in the discharge chamber, without special extraction assemblies required by prior ion thrusters. Hg sticking coefficients have been improved by a factor of 40 or more.

14 Claims, 7 Drawing Sheets

PLASMA/RADIATION ASSISTED MOLECULAR BEAM EPITAXY METHOD

CROSS-REFERENCE TO RELATED APPLICATION

This application is a continuation-in-part of copending U.S. patent application Ser. No. 281,309, filed Jan. 13, 1989, now abandoned.

BACKGROUND OF THE INVENTION

1. Field of the Invention

This invention relates to molecular beam epitaxial methods and apparatus for epitaxial growth of a compound upon a substrate.

2. Description of the Related Art

The present invention is concerned in general with the growth of structures by molecular beam epitaxy (MBE), and in particular with the use of MBE for the epitaxial growth of mercury telluride (HgTe), cadmium telluride (CdTe) and mercury cadmium telluride (HgCdTe) single crystal alloys, and HgTe/HgCdTe superlattices. HgCdTe is difficult to prepare for use in detection devices by either bulk or epitaxial techniques. The most commonly used epitaxial growth process for these materials is currently liquid phase epitaxy. Although high performance infrared detectors have been realized with growth by liquid phase epitaxy, the technique cannot produce abrupt heterojunctions and superlattices required for advanced opto-electronic devices. A review of various growth techniques is provided in J.P. Faurie et al., "Latest Developments in the Growth of $Hg_{1-x}Cd_xTe$ and CdTe-HgTe Superlattices by Molecular Beam Epitaxy", J. Vac. Sci. Technol. A, Vol. 1, No. 3, Jul.–Sep. 1983, pages 1593-97.

The MBE technique, on the other hand, is suitable for the growth of high quality epilayers, abrupt heterojunctions and alternate microstructures such as superlattices. This technique is described in J.P. Faurie et al., "Molecular Beam Epitaxy of II-VI Compounds: $Hg_{1-x}Cd_xTe$", J. Cryst. Growth, Vol. 54, No. 3, pages 582-85, 1981. However, the growth of HgCdTe by MBE is hard to control because of the excessive mercury re-evaporation from the surface during the deposition process.

MBE is a vacuum deposition process. The current implementation of the process uses several effusion cells, each cell comprising an electrically heated crucible containing one of the substances of the compound to be grown. Upon heating, the cells produce atomic or molecular beam fluxes of mercury, cadmium and tellurium. The fluxes are directed onto the surface of the substrate, where they react with each other and produce an epitaxial layer.

The growth rate of an MBE process is critically dependent upon the "sticking coefficient" of the materials being grown, i.e., the probability that a particle of the flux will adhere to the surface of the substrate. In the case of HgCdTe and HgTe/HgCdTe superlattice growth, the Hg sticking coefficient is very low. For a substrate temperature range of 170°-200° C., the Hg sticking coefficient has been found to vary between about $10^{-4}$ and $10^{-3}$. With conventional MBE growth, therefore, large Hg fluxes must be used. For example, as described in J.P. Faurie et al., "Molecular Beam Epitaxy of Alloys and Superlattices Involving Mercury", J. Vac. Sci. Technol., A3(1), 1985, pages 55-59, kg of mercury is required to grow a 75 micron thick layer of $Hg_{1-x}Cd_xTe$. This is an undesirably high rate of mercury consumption, and also requires a relatively high substrate temperature. Furthermore, it is difficult to control the electrical properties and to attain abrupt junctions for heterostructures.

SUMMARY OF THE INVENTION

In view of the above problems with the related art, the purpose of the present invention is to provide a new MBE method and apparatus that substantially increases the mercury sticking coefficient when used with a mercury compound, lowers both the amount of mercury consumption and the substrate temperature, provides a greater degree of control over both the growth and substrate conditions, and avoids unintended contamination of the growth material.

The invention accomplishes these purposes by providing one of the substances to be grown in the form of a highly ionized, low pressure plasma which, in the preferred embodiment, includes both ions and neutral particles of the substance, electrons, and also ionization and excitation radiation fields of the substance. Radiation can also be used by itself to assist epitaxial growth, but not as effectively as the full plasma. The plasma is formed by bombarding a neutral gas of the substance with electrons, the electron energy (discharge voltage), emission current and substance flow rate being controllable to control the relative proportions of ions and neutral particles, and of ionization as opposed to excitation radiation.

A chamber is described for forming the highly ionized, low pressure plasma which has an opening on one side for the simple outward diffusion of the plasma, without any special extraction facilities. Means are provided to introduce a gas of a desired substance such as mercury into the chamber, and for providing electrons to ionize and excite at least some of the gas. An anode is also provided within the chamber and maintained at a more positive voltage than the cathode to accelerate electrons and thereby produce ionization. Excitation radiation results from the spontaneous decay of excited gas particles, while ionization radiation results from ions and electrons recombining on interior surfaces. The substrate is held in the path of the plasma emitted from the chamber. The substrate is positioned with respect to the chamber so that at least about 20% of the radiation exiting the chamber reaches the substrate along with the plasma. A tube with radiation reflective walls may be used to confine the radiation between the chamber and substrate, with a magnetic coil preventing the plasma from re-combining at the tube walls. Means are provided for forming a flux from the other substance of the desired compound, and directing that flux onto the substrate to react with the plasma. The electron discharge is a DC mechanism, and the pressure is kept relatively low within the approximate range of $10^{-5}$–$10^{-4}$ Torr.

The described technique has been found to produce a marked increase in the mercury sticking coefficient, with an accompanying significant reduction in mercury consumption. Also, contamination of the plasma is avoided by employing a hollow cathode as the electron source with an emissive mix-free insert such as a rolled tantalum foil.

Further features and advantages of the invention will be apparent to those skilled in the art from the following detailed description of preferred embodiments, taken together with the accompanying drawings, in which:

DETAILED DESCRIPTION OF A PREFERRED EMBODIMENT

Figure 1:
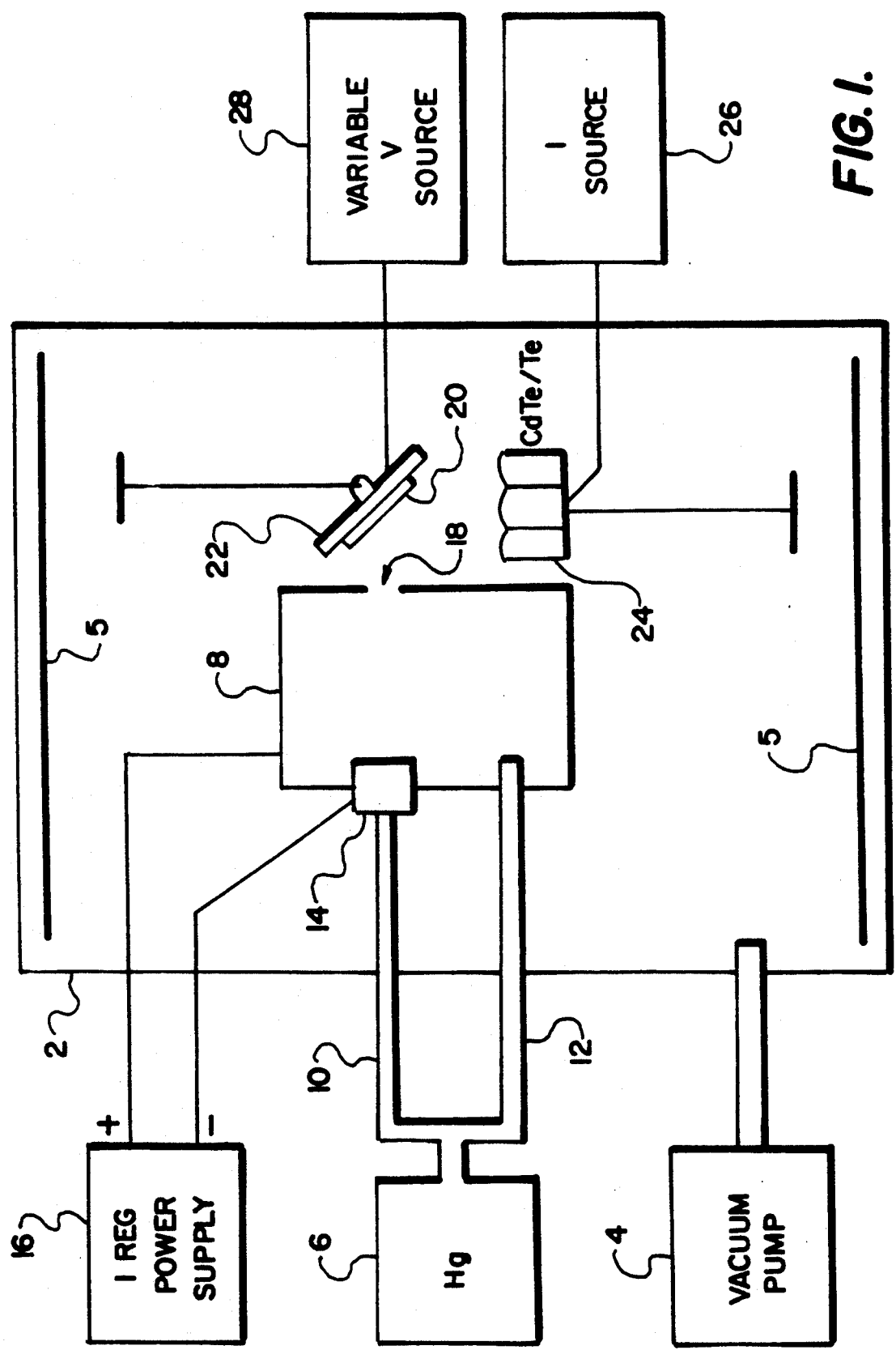
FIG. 1 is a simplified diagram showing the principal components employed in one embodiment of the plasma/radiation-assisted MBE apparatus of the present invention.

FIG. 1 illustrates the principal components of the apparatus employed in the present invention to produce a more efficient MBE. In accordance with the invention, one of the substances in a compound to be epitaxially grown is provided in the form of a highly ionized, low pressure plasma flux that includes neutral particles, ions, electrons, and both ionization and excitation radiation. The other substance of the compound is provided as a flux in either a vapor or plasma format. While FIG. 1 illustrates the preferred embodiment in which a plasma-delivered Hg is epitaxially grown together with evaporated Cd, Te or CdTe on a substrate, the invention is generally applicable to numerous compounds formed from Group II-VI and III-V combinations of the periodic table, and also to Group IV doping of compounds. However, because of the very substantial improvement offered to the sticking coefficient of Hg, the remainder of this specification will discuss this application of the invention.

The apparatus is enclosed within a vacuum housing 2, which is maintained at a pressure on the order of $10^{-7}$ Torr by vacuum pump 4 and LN$_2$ cryowall 5. Hg from a source 6 is introduced into a cylindrical plasma discharge chamber 8 within the housing through flow lines 10 and 12. Hg flowing through line 10 is vaporized and enters the chamber through a hollow cathode 14, which is energized by a current-regulating power supply 16 to inject electrons into the chamber at a specified discharge voltage ($V_D$) and current ($J_E$). The electrons ionize at least some of the Hg vapor within the chamber, forming a weakly ionized, low pressure plasma consisting of a mixture of neutral Hg particles, ions, electrons, excitation radiation and ionization radiation. The exact mechanism by which the plasma is formed is explained in further detail below.

The plasma diffuses out of chamber 8 through an exit port 18 onto a crystalline substrate 20, which is supported on an electrically isolated, thermally controlled substrate holder 22. A crucible 24 is heated by a current source 26 to produce a flux of either molecular CdTe, Cd, or Te. The flux is directed onto the substrate 20, where it reacts with the Hg plasma to produce an epitaxial growth of the desired compound. The particular Hg plasma source shown was capable of supplying a flux on the order of $10^{16}$ ions/sec/cm$^2$ (several mA/cm$^2$) of low energy (on the order of 30 eV) Hg$^+$ ions to the substrate, while with a substrate temperature fixed at 170° C. a neutral Te$_2$ flux from crucible 24 was adjusted to produce an indicated partial pressure at the substrate location of $1.5 \times 10^{-6}$ Torr (about $2 \times 10^{14}$ atoms/cm$^2$/sec). A significant increase in the Hg sticking coefficient compared to prior systems was noted, thus permitting a corresponding reduction in the Hg flux required for MBE growth.

The growth enhancement at the substrate 20 has been found to vary in positive proportion to the amount of radiation reaching the substrate along with the plasma. The radiation leaving the chamber 8 through exit port 18, however, progressively diverges to encompass a greater area as it travels away from the chamber, the radiation density generally following an inverse square law relationship with distance from the exit port. The substrate 20 should accordingly be positioned close enough to the exit port so that enough radiation reaches it to produce a significant enhancement in growth. In general, a radiation density at the substrate equal to at least about 20% of the radiation density at the exit port 18 is considered necessary to produce a significant growth enhancement, although a radiation density of 40% or more is preferable. In one experiment the diameter of the exit port was 3", and the substrate was located between 1" and 2" away, with good growth results. The substrate was about ¼" square (the accompanying figures are not to scale), so that the gradient in radiation intensity from one side of the substrate to the other due to the substrate being angled to the axis of the plasma/radiation path was not significant. The plasma also disperses with distance from the exit port 18, but at a lesser rate than the radiation.

In the system described thus far, the Hg plasma supplied to the substrate can be varied by changing $V_D$ and/or $J_E$ and/or the mercury flow rate. However, in some applications a very rapid change in the plasma reaching the substrate is desired, such as in the formation of superlattices with very abrupt boundaries between Hg and Te layers. In this case, a more rapid response in the plasma reaching the substrate might be achieved by applying a voltage signal from a variable voltage source 28 to the substrate 20, via substrate holder 22. The density of ions or electrons in the plasma reaching the substrate might then be controlled by biasing the substrate voltage either positive or negative. Although not yet demonstrated, it is believed that a very rapid response might be achieved with this technique.

Figure 2:
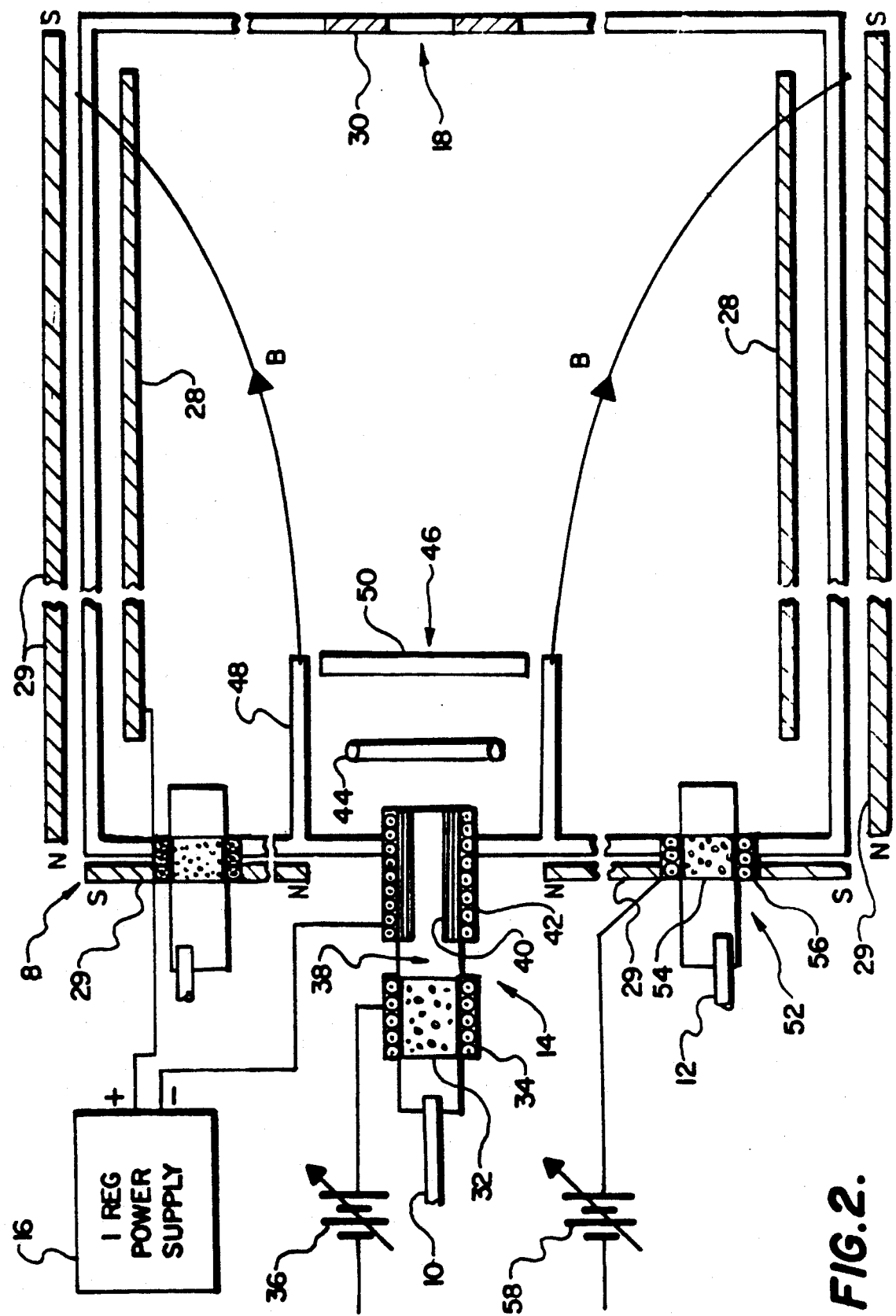
FIG. 2 is a sectional view, partly in block diagram form, of a discharge chamber used in a preferred form of the invention.

Further details of plasma chamber 8 are furnished in FIG. 2. A cylindrical anode 28 is positioned within the chamber adjacent to the cylindrical chamber wall between cathode 14 and exit port 18. The anode 28 serves to collect discharge current and plays a role in the production of neutral particles and ionization radiation, as discussed below. It is preferably water-cooled and coated with Cd, and is maintained at a positive voltage relative to the cathode. A divergent magnetic field which efficiently confines the low pressure, highly ionized plasma is produced by alnico permanent magnet bars 29 arranged along the perimeter of the discharge chamber.

The exit port 18 is preferably formed by a metal plate 30, such as stainless steel, which is coated with Cd and has a central opening approximately 7.5 cm in diameter. Unlike related ion thrusters which employ ion extraction mechanisms, the plasma inside the chamber simply diffuses out of exit port 18; a typical prior ion thruster is described in Harold R. Kaufman, "Technology of Electron-Bombardment Ion Thrusters", *Advances in Electronics and Electron Physics*, Vol. 36 (L. Marton, ed.) Academic Press, New York, 1974, pp. 265-373. Despite this, the large majority of the output from the plasma chamber may be ions, as opposed to neutral particles. This is because the ions are driven out by internal electric fields within the chamber, whereas neutral atoms are moved out by random thermal motion; since a relatively low temperature source is used, the density of neutral particles in the chamber output can be strictly limited. The interior of the discharge chamber, including the anode 28, is preferably coated with Cd to minimize sputter-induced impurities evolving from the plasma source.

The cathode 14 has a unique structure which prevents it from adding impurities to the Hg introduced into the chamber. Liquid Hg is fed through supply line 10, which terminates at a porous tungsten plug 32 in the cathode tube. Plug 32 is heated to a temperature of about 300° C. by a surrounding heating coil 34, which is powered by a variable current source 36. The liquid Hg vaporizes and migrates through the pores of plug 32 to enter the cathode chamber 38. As the Hg vapor continues downstream, it passes through the interior of an insert sleeve 40, which is heated by an electric coil heater 42 to emit electrons into the Hg vapor passing through the insert. The design of the insert 40 is unique, and offers a distinct advantage over prior ion thrusters. Inserts employed in the past have typically been chosen to have a low work function, so that electrons can be easily emitted. A tungsten insert impregnated with BaO, having a work function of about 2-2.5 eV, has commonly been used. However, BaO is an emissive material which gives off oxide and Ba, Ca, and Al emissions that can contaminate the substrate.

In accordance with the present invention, an emissive-mix-free insert is used in the hollow cathode 14. The new insert is formed from a refractory metal, such as tantalum or tungsten, in the form of a foil which is rolled up in a hollow spiral. Tantalum is preferred because it is less brittle than tungsten. The work function of tantalum is about 4.4 eV. Once the plasma is lit the cathode heater can be turned off, and the plasma self-heats the cathode insert. Ions from the plasma bombard the cathode with an energy sufficient to heat the insert to thermionic emission temperatures.

A small loop anode 44 called a keeper is positioned within the discharge chamber immediately in front of hollow cathode 14. This device draws sufficient electron current to initiate and maintain the cathode discharge in the presence of low emission conditions and plasma fluctuations. The cathode is isolated from the main discharge chamber via a baffle system 46, consisting of a cylindrical baffle 48 surrounding the cathode exit, and a circular baffle plate 50 in-line with the cathode exit. The baffle system, typically 5-8 cm in diameter, tends to isolate the plasma in the cathode from that in the main discharge chamber. The magnetic field from the permanent magnet bars 29 efficiently confines the plasma.

Hg is also introduced directly into the discharge chamber through a main plenum 52. This is fed with liquid Hg from line 12, and includes a porous tungsten plug 54 which is heated by a surrounding electrical coil 56 supplied by a variable current source 58. As with the initial portion of the hollow cathode, a tungsten plug 54 in the main plenum is heated to about 300° C. to vaporize the liquid Hg, which then migrates through the pores of the plug directly into the discharge chamber. The flow rate of mercury vapor produced by the main plenum plug 54 and cathode plug 32 can be adjusted by varying the currents applied to their respective heating coils.

Figure 3:
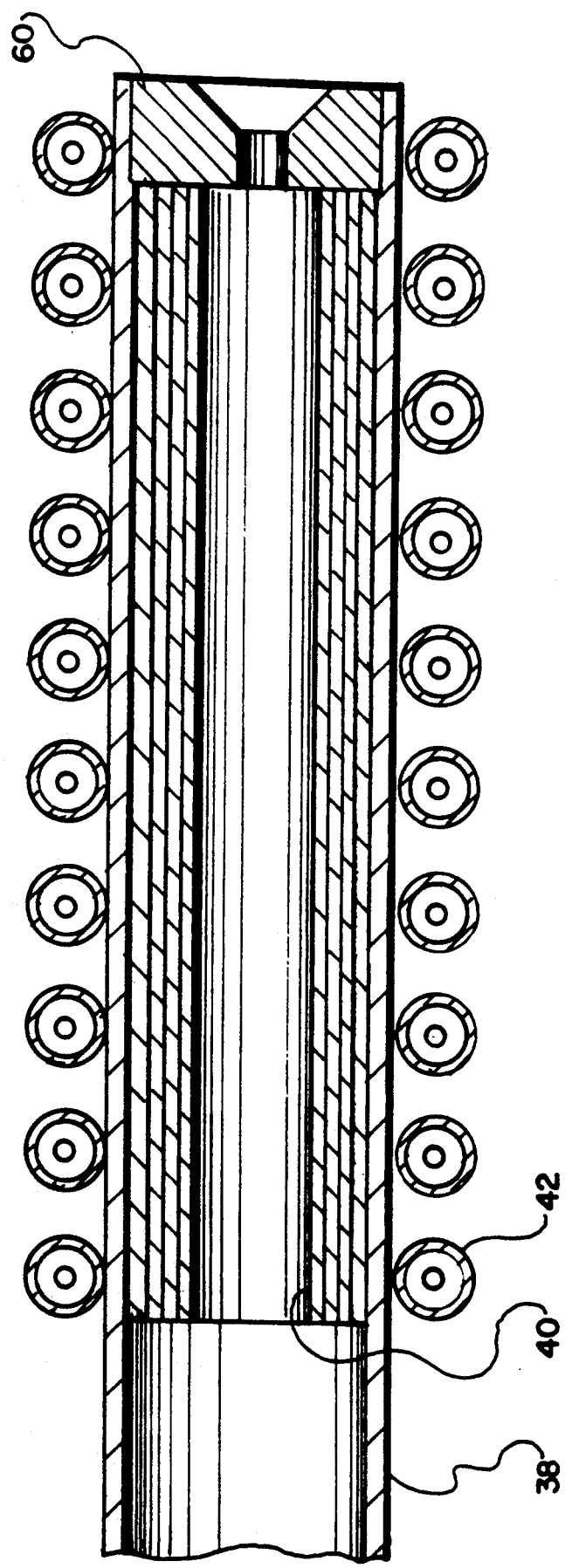
FIG. 3 is a sectional view of the preferred form of hollow cathode used as an electron source, including a high work function insert.

Further details of the hollow cathode are provided in FIG. 3. The emissive-mix-free tantalum insert 40 is formed from a foil about 0.013-mm thick, rolled in six or seven turns with an inside diameter of about 3.8-mm. The insert is about 25-mm long. The tube forming the cathode chamber 38 is about 6.4-mm in diameter, is preferably formed from Mo or Ta, and is surrounded by about thirteen turns of the heating coil 42 in the vicinity of the tantalum insert. An orifice plate 60 is positioned at the end of the cathode tube, and has a flared central opening with a minimum diameter of 0.76 mm to emit the Hg vapor and electrons into the discharge chamber. Orifice plate 60 is preferably formed from thoriated tungsten (W with about 2% Th). Hg is introduced into the discharge chamber through the hollow cathode 14 and main plenum 52 at a pressure preferably in the range of about $10^{-5}$ to $10^{-4}$ Torr.

Figure 4:
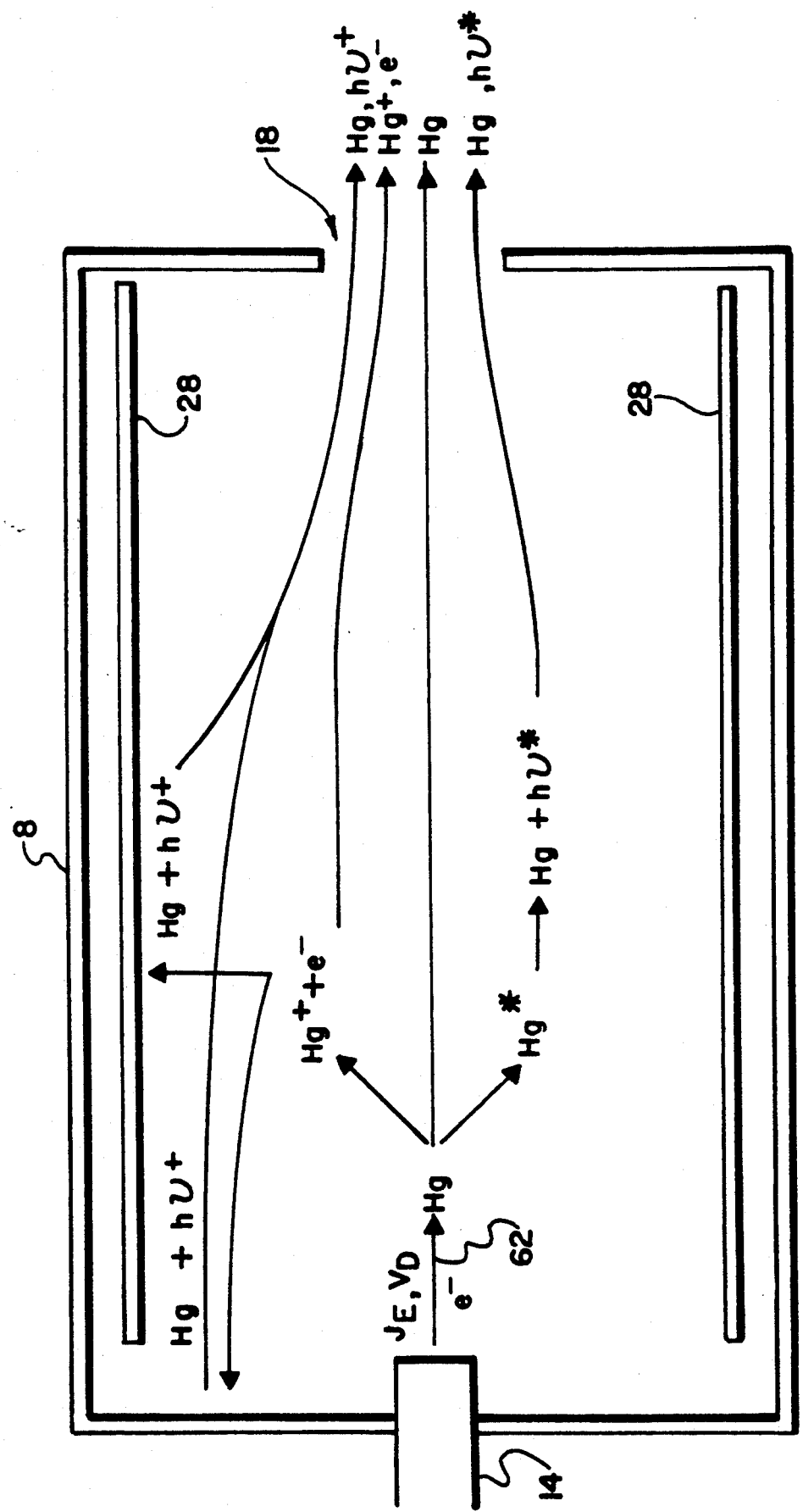
FIG. 4 is a diagram illustrating the mechanisms by which plasma and radiation are produced within the discharge chamber.

The manner in which a plasma consisting of neutral Hg particles, Hg ions, electrons, ionization radiation and excitation radiation is produced by the electrons supplied by cathode 14 is illustrated in FIG. 4. Electrons 62 are emitted from cathode 14 at a given discharge voltage $V_D$ and current $J_E$. The electrons bombard neutral mercury atoms within the chamber. This bombardment will result in a combination of excited Hg* atoms, Hg+ ions and electron pairs, and neutral Hg atoms; the proportion of each is determined by the electron energy and plasma confinement conditions. There will also be a small number of Hg++ ions produced, primarily by electron bombardment of Hg+, but for simplicity this reaction is not considered in this description. The excited Hg* atoms spontaneously decay to neutral Hg atoms, giving off excitation radiation $h\upsilon^*$. The Hg+ ion and electron pairs either diffuse out of the discharge chamber, or to the anode 28, cathode 14, or cathode surfaces 8 where the ions and electrons recombine to form Hg atoms, giving off ionization energy $h\upsilon^+$ in the process. The various proportions of Hg, Hg+, electrons, $h\upsilon^*$ and $h\upsilon^+$ will all diffuse out of the discharge chamber and be applied to the substrate to participate in the epitaxial growth.

It has been found that the relative proportion of ions to neutrals and radiation can be varied by varying $V_D$, $J_E$ and/or the mercury flow rate. $V_D$ also controls the ion energy, and an ability to control this parameter is important in limiting the ion energy so that lattice damage is prevented during ion deposition. An ionization level of approximately 10% is preferably established.

The manner in which $V_D$ can be controlled is known from the prior art of ion thrusters. To increase $V_D$ for a constant cathode current $J_E$, the Hg flow rate through the cathode is first reduced by reducing the power from current source 36 (referring to FIG. 2). For a fixed cathode current, this will cause the discharge voltage $V_D$ to increase. Since reducing the cathode flow rate reduces the amount of propellant introduced into the discharge chamber, the ion current exiting the source 36 will be reduced. To maintain this ion current constant, the Hg flow through the main plenum 52 is simultaneously increased. This will have a tendency to reduce the discharge voltage as well, but is easily compensated for by additionally reducing the cathode flow rate slightly. An increase in the discharge voltage in the manner described will always increase the ionization efficiency of the ionized substance (i.e., increase the ratio of ions to neutrals). The Hg flow through the cathode 14 and main plenum 48 can be varied in exactly the opposite manner to reduce $V_D$ and shift the plasma away from ions and more towards neutral particles.

If it is desired to keep the ion energy fixed while increasing the ions/neutrals ratio, $J_E$ is increased instead of $V_D$. To increase the proportion of ions, $J_E$ is increased by adjusting power supply 16, leading to an increase in $V_D$. The flow of Hg through cathode 14 is then increased to cancel the rise in $V_D$. At the same time, the Hg flow rate through the main plenum 28 is reduced to maintain the absolute number of ions within the discharge chamber constant, but with an increased ion ratio because of the increase in $J_E$.

A large variation in the proportion of ions is possible with the present invention. An ion output of at least 90% has been demonstrated, without any form of ion extraction assembly.

Marked improvements have been noted in the Hg sticking coefficient. While the greatest improvement is achieved with a plasma consisting of neutral particles, ions, electrons, and both ionization and excitation radiation reaching the substrate, greater sticking coefficients have also been achieved with neutrals and both ionization and excitation radiation alone reaching the substrate. In one demonstration, a fine wire mesh was placed over the exit aperture 18 of the plasma chamber to prevent the Hg plasma from exiting. Instead, only Hg atoms and Hg-excitation and ionization radiation were allowed to impinge upon the substrate. In this experiment an ionization gauge was rotated into the location of the substrate to measure the Hg partial pressure and to verify that little, if any, plasma was reaching the substrate. The discharge chamber was operated to produce an $Hg^o$ flux of $5 \times 10^{15}$ atoms/cm$^2$-sec ($\approx 0.8$ mA/cm$^2$) to the substrate. As will be shown in the discussion below, this should have resulted in an Hg-deficient HgTe layer. The neutral Te$_2$ flux was adjusted to produce a partial pressure of $1.5 \times 10^{-6}$ Torr ($1.9 \times 10^{14}$ atom/cm$^2$-sec) at the location of the substrate. In the presence of the Hg-excitation and ionization radiation emitted from the plasma source, an enhancement of about 10% in the Hg sticking coefficient was noted.

In another demonstration, a single, crystal CdTe (111) substrate was confined within an LN$_2$-pumped vacuum system with a baseline vacuum pressure of $10^{-7}$ Torr, at a temperature of 170° C. Controlled fluxes of Te$_2$ and Hg atoms were produced by electrically heated crucibles, with the Te$_2$ and Hg fluxes directed onto the substrate. An exposed ionization gauge was rotated in the location of the substrate to measure the partial pressures of the fluxes. The Te$_2$ flux was maintained at a pressure of $1.5 \times 10^{-6}$ Torr ($1.9 \times 10^{14}$ atoms/cm$^2$-sec). The Hg flux was then varied over three orders of magnitude, ranging from $3.2 \times 10^{14}$ atoms/cm$^2$-sec to $4 \times 10^{16}$ atoms/cm$^2$-sec.

Figure 5:
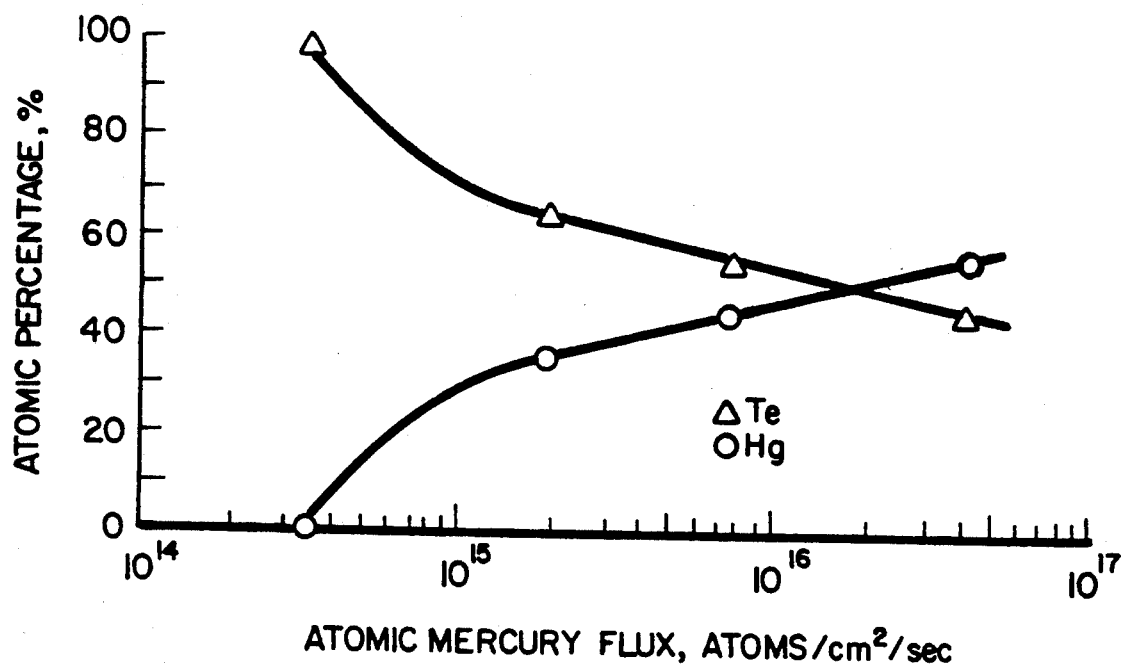
FIG. 5 is a graph of the results of a control demonstration in which HgTe was grown by MBE.

The variation of the atomic percentage concentration of Hg and Te in the grown HgTe films with the amount of incident Hg flux is charted in FIG. 5. The results indicate that for an incident Hg flux of less than $1.8 \times 10^{16}$ atoms/cm$^2$-sec, the grown HgTe films were Te-rich (Hg-deficient). For higher Hg fluxes, the films were Hg-rich (Te-deficient).

To assess the effect of a radiation assisted molecular beam epitaxy technique, the Hg$^o$ flux was next set to a value of $1.8 \times 10^{15}$ atoms/cm$^2$-sec. Based upon the results illustrated in FIG. 5, this Hg$^o$ flux would be expected to result in a Hg-deficient film. For this experiment, a Hg lamp which provided a radiation source with predominantly Hg-excitation radiation was mounted approximately 5 cm from the CdTe substrate. The lamp radiated at 255 nm, which is the first excitation potential of Hg. The power density of the lamp at a distance of 1.9 cm was 4.5 mW/cm$^2$.

Figure 6:
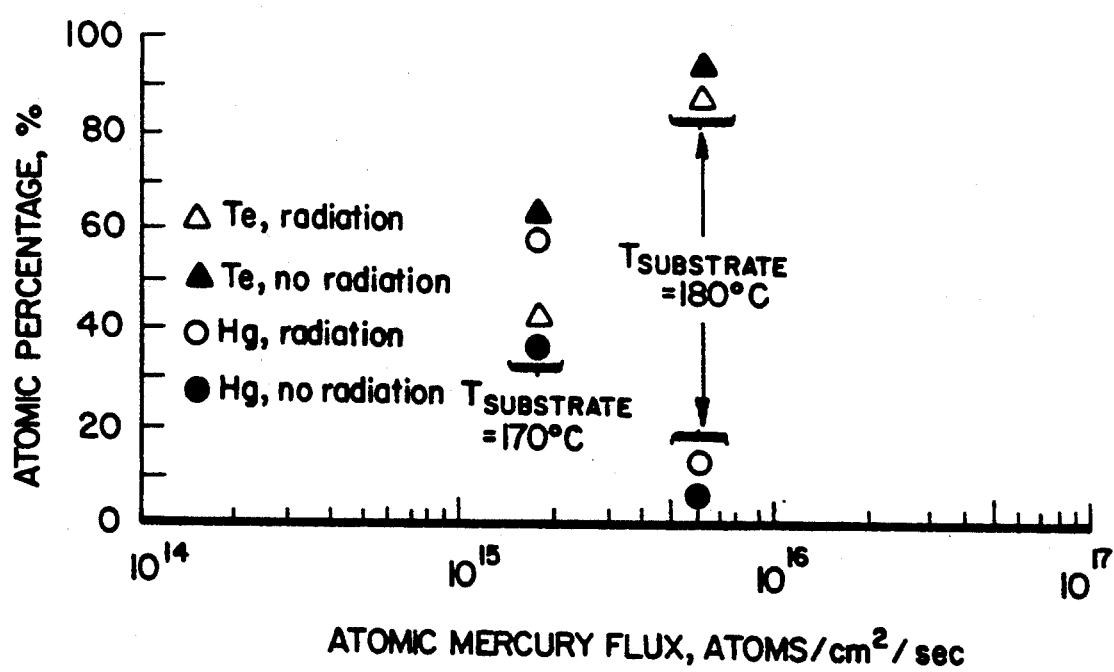
FIG. 6 is a graph comparing the results of a radiation assisted MBE growth of HgTe with the results illustrated in FIG. 5.

The variation in the atomic percentage of Hg and Te in the HgTe films formed with and without the Hg-radiation lamp is shown in FIG. 6. In the presence of Hg excitation radiation, the Hg atomic percentage increased from a Hg-deficient level (approximately 35%) to Hg-rich (approximately 59%). In a further experiment the substrate temperature was increased from 170° C. to 180° C., and the incident Hg$^o$ flux was increased to $6 \times 10^{15}$ atoms/cm$^2$-sec. Under these conditions, the Hg atomic percentage again increased substantially, from 5% in the absence of the radiation field to 13% in the presence of the field.

The results shown in FIGS. 5 and 6 suggest that for HgTe films grown by conventional MBE techniques, the "sticking coefficient" of Hg$^o$ atoms can be approximately doubled by performing the growth in the presence of Hg excitation radiation. It is anticipated that further enhancements can be achieved by optimum selections for the intensity of the light source, substrate temperature, and incident Hg and Te$_2$ flux conditions.

When a full plasma consisting of Hg$^+$, Hg, electrons, ionization radiation and excitation radiation was applied from the discharge chamber described above, the Hg sticking coefficient was increased by a multiple of at least 40, with fluxes of about 90% Hg$^+$ and about 10% Hg reaching the substrate. The wavelength of the excitation radiation was calculated as 259 nm, while that of the ionization radiation was calculated as 119 nm.

Figure 7:
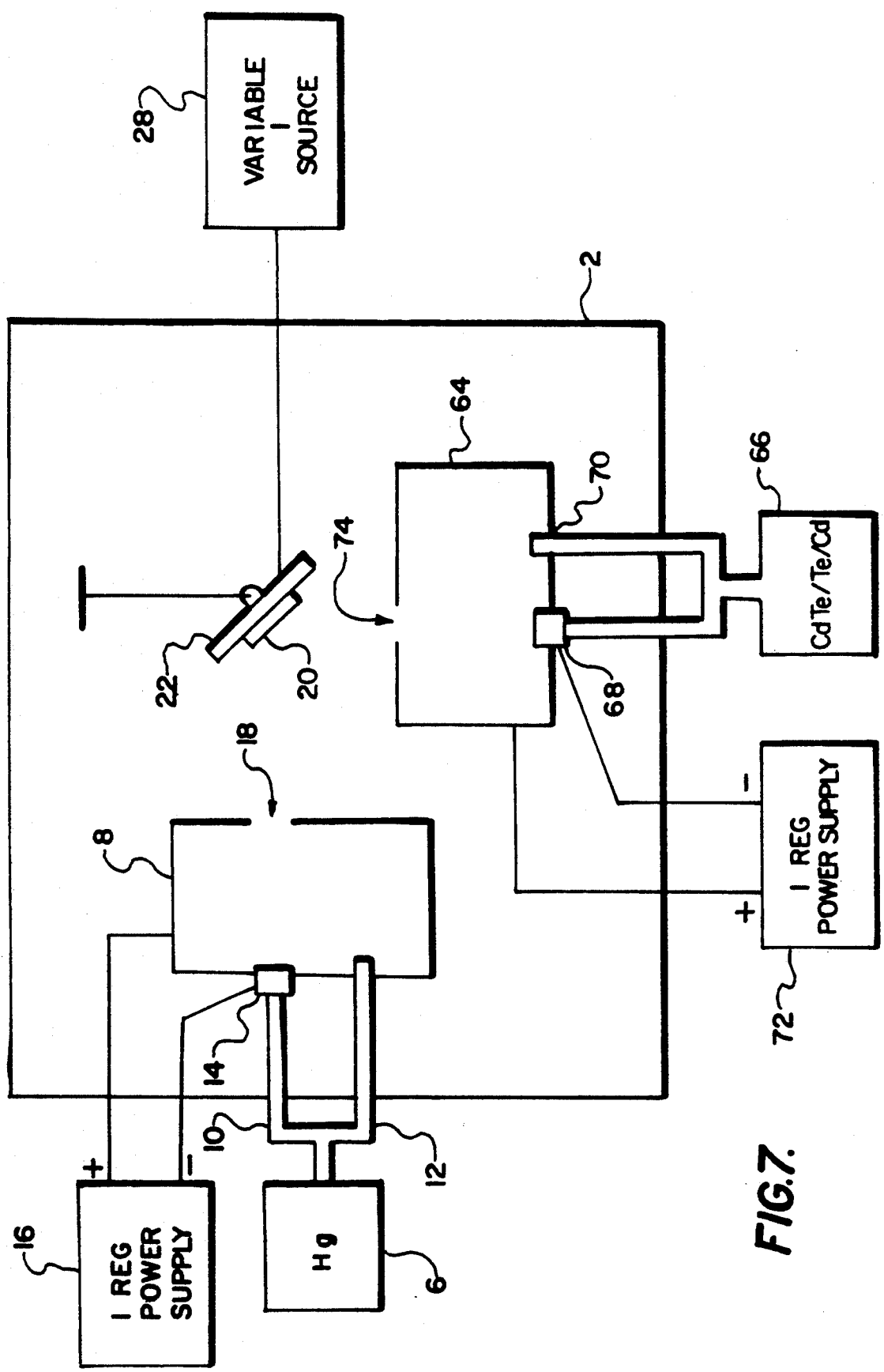
FIG. 7 is a simplified diagram of another embodiment in which both substances to be grown are presented to the substrate as plasmas.

Referring now to FIG. 7, another embodiment of the invention is shown in which a flux of CdTe or Te plasma is provided from a second discharge chamber 64, rather than from a heated crucible. Discharge chamber 64 for CdTe, Cd or Te is similar to Hg discharge chamber 8, with a CdTe or Te source 66 supplying a cathode 68 and a main plenum 70; a current regulated power supply 72 is provided for cathode 68. A CdTe, Cd or Te plasma is emitted through exit port 74 onto the substrate 20, where it reacts with the Hg plasma to produce an epitaxial growth.

Figure 8:
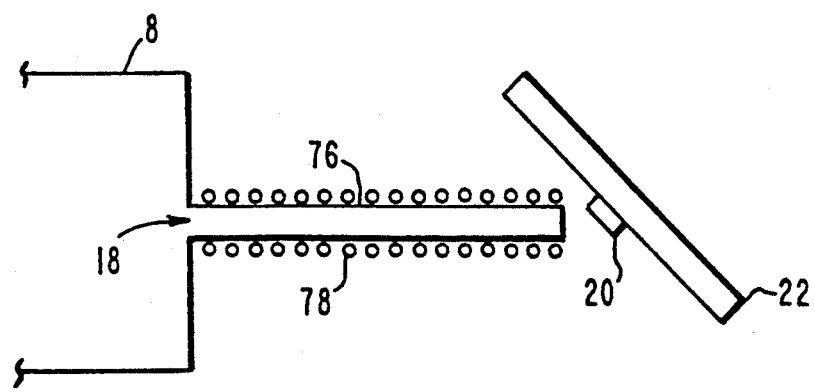
FIG. 8 is a simplified diagram of another embodiment in which a radiation reflective tube and magnetic coil are used to confine the radiation and plasma between the plasma chamber and the substrate.

FIG. 8 illustrates another embodiment in which a radiation confining tube 76 is employed in conjunction with the positioning of substrate 20 so that sufficient radiation reaches the substrate to significantly enhance the growth there. Tube 76 is formed with inner radiation reflective walls such as aluminum or molybdenum to effectively confine the radiation. It is preferably equal in diameter to the exit port 18, and extends from the exit port to a location close to substrate 20. A magnetic coil 78 is wound around the tube to guide the plasma along the interior of the tube, thereby preventing it from re-combining at the tube walls.

Various embodiments of a highly efficient MBE system have thus been shown and described. Since numerous variations and alternate embodiments will occur to those skilled in the art, it is intended that the invention be limited only in terms of the appended claims.

We claim:

1. A method of epitaxially growing upon a substrate a compound having a plurality of constituent substances, comprising:

forming a plasma within a chamber at a pressure not greater than about $10^{-4}$ Torr, said plasma comprising a mixture of ions of one of said substances, neutral particles of said one substance, and electrons, generating radiation within the chamber from said one substance, diffusing at least a substantial portion of said plasma onto the substrate from said chamber, allowing said radiation to exit the chamber, confining said plasma and radiation to a substantially linear path between said chamber and substrate reflecting dispersive radiation back into said substantially linear path so that the radiation density of said one substance at the substrate is at least about 20% of the radiation density exiting the chamber, forming a flux comprising particles of at least one other substance in said compound, and directing said flux onto the substrate to react with the plasma thereon, said radiation at the substrate substantially enhancing the sticking coefficient of said one substance on the substrate, compared to its sticking coefficient in the absence of said radiation.

2. The method of claim 1, wherein gas of said one substance is bombarded with electrons to produce ions and excited particles of said one substance, and said radiation comprises ionization radiation resulting from neutralization of some but less than all of said ions, and excitation radiation resulting from spontaneous decay of at least some of said excited particles.

3. The method of claim 1, wherein said flux of particles of said other substance comprises a plasma comprising a high concentration of ions of said other substance, neutral particles of said other substance and electrons.

4. The method of claim 3, wherein said flux further comprises ionization radiation resulting from neutralization of some but less than all of said ions of said other substance, and excitation radiation resulting from spontaneous decay of excited particles of said other substance.

5. The method of claim 1, wherein said plasma is formed within said chamber by establishing a direct current discharge of electrons into a gas of said one substance, and wherein said DC discharge forms said plasma with an ion energy low enough to prevent substrate lattice damage yet high enough to epitaxially grow said compound.

6. The method of claim 5, wherein the relative proportions of ions and neutral particles in the plasma is controlled by controlling the voltage at which electrons are discharged into said gas and the discharge current.

7. The method of claim 5, wherein said DC discharge forms said plasma with an ion energy on the 30 eV.

8. A method of epitaxially growing a mercury (Hg) compound upon a substrate, comprising:

introducing Hg gas into a chamber at a pressure not greater than about $10^{-4}$ Torr, forming a plasma with said Hg gas comprising the steps of:

discharging electrons into said gas at a predetermined discharge voltage $V_D$ and current $J_E$ to produce Hg ions and excited Hg particles, and neutralizing some but less than all of said Hg ions to produce ionization radiation, and allowing at least some of said excited Hg particles to produce excitation radiation through spontaneous decay, diffusing Hg ions, Hg neutral particles, electrons, ionization radiation and excitation radiation from said chamber onto said substrate, confining said plasma and radiation to a substantially linear path between said chamber and substrate reflecting dispersive radiation back into said substantially linear path so that the radiation density of said Hg reaching the substrate is at least about 20% of the radiation density leaving the chamber, forming a flux comprising particles of at least one other substance which is reactable with Hg, and directing said flux onto the substrate to react with the Hg thereon.

9. The method of claim 8, wherein said other substance is tellurium ($Te_2$).

10. The method of claim 8, wherein said other substance is cadmium telluride (CdTe).

11. The method of claim 8, wherein the relative proportions of ions and neutral Hg particles directed onto the substrate is controlled by controlling $V_D$ and $J_E$.

12. The method of claim 8, wherein $V_D$ is selected to produce Hg ions with an energy low enough to prevent substrate lattice damage yet high enough to epitaxially grow said compound.

13. The method of claim 12, wherein $V_D$ is on the order of 30 volts.

14. The method of claim 12, wherein said plasma is formed within an ion energy on the order of 30 eV.

* * * * *